United States Patent
Nakayama et al.

(10) Patent No.: US 8,927,972 B2
(45) Date of Patent: Jan. 6, 2015

(54) CURRENT-AMPLIFYING TRANSISTOR DEVICE AND CURRENT-AMPLIFYING, LIGHT-EMITTING TRANSISTOR DEVICE

(75) Inventors: Ken-ichi Nakayama, Yonezawa (JP); Junji Kido, Yonezawa (JP); Yong-Jin Pu, Yonezawa (JP); Fumito Suzuki, Yonezawa (JP); Naomi Oguma, Chuo-ku (JP); Naoki Hirata, Chuo-ku (JP)

(73) Assignees: Dainichiseika Color & Chemicals Mfg. Co., Ltd., Chuo-ku, Tokyo (JP); Ken-ichi Nakayama, Yonezawa-shi, Yamagata (JP)

( * ) Notice: Subject to any disclaimer, the term of this patent is extended or adjusted under 35 U.S.C. 154(b) by 66 days.

(21) Appl. No.: 13/392,409

(22) PCT Filed: Sep. 3, 2010

(86) PCT No.: PCT/JP2010/065576
§ 371 (c)(1),
(2), (4) Date: Feb. 24, 2012

(87) PCT Pub. No.: WO2011/027915
PCT Pub. Date: Mar. 10, 2011

(65) Prior Publication Data
US 2012/0146011 A1 Jun. 14, 2012

(30) Foreign Application Priority Data
Sep. 4, 2009 (JP) ................. 2009-205022

(51) Int. Cl.
*H01L 29/08* (2006.01)
*H01L 51/00* (2006.01)
*H01L 51/52* (2006.01)
*B82Y 10/00* (2011.01)
*H01L 51/05* (2006.01)

(52) U.S. Cl.
CPC ............ *H01L 51/5296* (2013.01); *B82Y 10/00* (2013.01); *H01L 51/0504* (2013.01); *H01L 51/0046* (2013.01); *H01L 51/0053* (2013.01); *H01L 51/0067* (2013.01); *H01L 51/0081* (2013.01)
USPC ................ 257/40; 257/E51.024; 438/350

(58) Field of Classification Search
CPC ............ H01L 51/0504; H01L 51/5203; H01L 51/5296; H01L 51/0046
USPC ........................ 257/40, E51.024; 438/350
See application file for complete search history.

(56) References Cited

U.S. PATENT DOCUMENTS 5,315,129 A * 5/1994 Forrest et al. ............... 257/21
6,037,718 A 3/2000 Nagami (Continued)

FOREIGN PATENT DOCUMENTS

EP 2 009 700 A1 12/2008
JP 2003-101104 A 4/2003

(Continued)

OTHER PUBLICATIONS

Nakayama, K., et al., "High-Current and Low-Voltage Operation of Metal-Base Organic Transistors with LIF/Al Emitter," Applied Physics Letters, vol. 88, No. 15 (2006), pp. 153512-1-153512-3.

(Continued)

*Primary Examiner* — Steven J Fulk
(74) *Attorney, Agent, or Firm* — Taft Stettinius & Hollister LLP

(57) ABSTRACT

A current-amplifying transistor device is provided, between an emitter electrode and a collector electrode, with two organic semiconductor layers and a sheet-shaped base electrode. One of the organic semiconductor layers is arranged between the emitter electrode and the base collector electrode, and has a diode structure of a p-type organic semiconductor layer and an n-type p-type organic semiconductor layer. A current-amplifying, light-emitting transistor device including the current-amplifying transistor device and an organic EL device portion formed in the current-amplifying transistor device is also disclosed.

30 Claims, 4 Drawing Sheets

(56) References Cited

U.S. PATENT DOCUMENTS

| | | | |
|---|---|---|---|
| 2003/0085397 A1* | 5/2003 | Geens et al. | 257/40 |
| 2007/0176166 A1* | 8/2007 | Lin et al. | 257/40 |
| 2009/0108749 A1* | 4/2009 | Yokoyama et al. | 313/504 |
| 2009/0230384 A1* | 9/2009 | Meng et al. | 257/40 |
| 2010/0044738 A1* | 2/2010 | Gaertner et al. | 257/98 |
| 2010/0073056 A1* | 3/2010 | Chu et al. | 327/171 |
| 2010/0213447 A1* | 8/2010 | Fujimoto et al. | 257/40 |
| 2010/0265236 A1* | 10/2010 | Loebl et al. | 345/211 |

FOREIGN PATENT DOCUMENTS

| | | | |
|---|---|---|---|
| JP | 2007-258308 A | | 10/2007 |
| JP | 2009-81237 A | | 4/2009 |
| JP | 2009272442 A | * | 11/2009 |
| WO | 02/33762 A1 | | 4/2002 |
| WO | WO 2007119490 A1 | * | 10/2007 |
| WO | WO 2008129472 A1 | * | 10/2008 |
| WO | WO 2009028706 A1 | * | 3/2009 |

OTHER PUBLICATIONS

Yoneda, K., et al., "Stacked Device of Polymer Light-Emitting Diode Driven by Metal-Base Organic Translator," Japanese Journal of Applied Physics, vol. 47, No. 2 (2008), pp. 1293-1296.

Nakayama, K., et al., "Improvement in the On/Off Ratio of a Vertical-Type Metal-Base Organic Transistor by Heat Treatment in Air," Organic Electronics, vol. 10 (2009), pp. 543-546.

European Patent Office, Extended Search Report for European Patent Application No. 10 81 3859, Dec. 12, 2012, Rijswijk, Netherlands.

Ou, T-M., et al., "All-Organic Hot-Carrier Triodes with Thin-Film Metal Base," Applied Physics Letters, vol. 89 (2006), pp. 183508-1-183508-3.

Huang, J., et al., "Ambipolar Permeable Metal-Base Transistor Based on NPB/C60 Heterojunction," Organic Electronics, vol. 10 (2009), pp. 210-213.

* cited by examiner

CURRENT-AMPLIFYING TRANSISTOR DEVICE AND CURRENT-AMPLIFYING, LIGHT-EMITTING TRANSISTOR DEVICE

TECHNICAL FIELD

This invention relates to a current-amplifying transistor device and a current-amplifying, light-emitting transistor device, each of which has current-amplifying capability, and more specifically, to a current-amplifying transistor device and a current-amplifying, light-emitting transistor device, each of which can perform large-current modulation at a low voltage and is superb in on/off ratio, and therefore, is excellent in driving an organic EL display or the like.

BACKGROUND ART

In recent years, flat-screen TV sets and notebook-size personal computers have come into wide use, resulting in increasing demands for liquid crystal displays, organic EL displays, electronic paper displays, and the like. For driving devices in these displays, field-effect transistors (FETs) are used. FETs making use of silicon, an inorganic material, are primarily used these days, but reports have been made about displays that use organic transistor devices for lower manufacturing cost, larger screen size and flexibilization.

Most of such displays, however, rely upon a combination of organic field-effect transistors (OFETs) and liquid crystal or electrophoretic cells. OFET can hardly provide a large current due to its structure and low mobility. Practically no report has hence been made about a case in which OFETs are used as drive devices in an organic EL display, said drive devices being current-driven devices that require a large current. There is, accordingly, an outstanding desire for the development of organic transistor devices that can output a large current at a low voltage and can drive an organic EL display.

For obtaining a large current with OFET, its channel length needs to be shortened at present. With a patterning technology developed with a view to mass production, however, it is difficult to shorten the channel length to several micrometers or less. To resolve this problem, research is under way about "vertical-type transistor structures" that can obtain a large current in a low voltage range by causing a current to flow in the thickness direction of films. Film thicknesses generally employed in vertical-type transistors range from several tens nanometers to several hundreds nanometers, and can be controlled with high accuracy on the order of several angstroms. The fabrication of a vertical-type transistor with its channel extending in the film thickness direction (vertical direction) has a possibility that a channel length of 1 μm or less may be easily realized to obtain a large current. As such vertical-type organic transistor devices known to date, there are vertical-type transistors of a polymer-grid triode structure, in each of which a self-organizing network structure in the form of a polyaniline film is used as a grid electrode, and static induction transistors (SITs) in each of which a source-drain current is controlled by modulating the width of a depletion layer in a microstripe-shaped intermediate electrode.

Recently, there has been proposed a vertical-type organic transistor device that has a stacked structure of organic semiconductor/metal/organic semiconductor and can show high-performance transistor characteristics (PTL 1). This vertical-type transistor device is provided, between an emitter electrode and a collector electrode, with organic semiconductor layers and a stripe-shaped intermediate metal electrode. Upon passage of electrons, which have been injected from the emitter electrode, through the intermediate metal electrode in the organic transistor device, current amplification similar to that available from a bipolar transistor is observed, and the intermediate metal electrode serves like a base electrode. The vertical-type transistor device is, therefore, called a "metal-base organic transistor" (which may hereinafter be called "MBOT").

In MBOT, no substantial current flows when an output voltage is applied between the emitter electrode and the collector electrode and no voltage is applied between the emitter electrode and the base electrode, but a current flows between the emitter electrode and the collector electrode when a voltage is applied between the emitter electrode and the base electrode. The current that flows between the emitter electrode and the collector electrode is a collector current, while the current that flows between the emitter electrode and the base electrode is a base current. Compared with the base current that increases upon application of a base voltage, the collector current rapidly increases. MBOT, therefore, can serve as a device that can modulate the collector current by the base voltage. A "leakage current" that may happen to flow when a voltage is applied between the emitter electrode and the collector electrode but no voltage is applied between the emitter electrode and the base electrode is an off-state current, while a current that flows upon application of a voltage between the emitter electrode and the base electrode is an on-state current. MBOT is a transistor device that allows substantially no off-state current and can provide a large on-state current.

As the structure of an organic transistor (MBOT), there has been reported MBOT that can be readily fabricated by providing a transparent ITO electrode as a collector electrode and stacking organic semiconductor/metal/organic semiconductor on the transparent ITO electrode by vacuum deposition (PTL 2). Employed as the organic semiconductors are N,N'-dimethylperylenetetracarboxylic acid diimide (Me-PTCDI) and fullerene (C60), which are n-type organic semiconductor materials. Employed as electrode materials, on the other hand, are Al for a base electrode and Ag for an emitter electrode. By introducing a dark-current suppression layer and subjecting the base electrode to heat treatment, this MBOT serves as a transistor device that can perform large-current amplification with an improved on/off ratio (ratio of on-state current to off-state current). As is appreciated from the foregoing, MBOT is characterized in that it does not need micropatterning for a microgrid-shaped electrode or microstripe-shaped electrode although it is a vertical-type transistor.

Also reported are organic transistor devices (MBOTs), each of which is reported to provide good current amplification characteristics and on/off ratio without applying heat treatment or the like. They are MBOTs each having organic semiconductor layers and a sheet-shaped base electrode between an emitter electrode and a collector electrode and also having an energy barrier layer and a charge-pass promoting layer between the base electrode and the collector electrode (PTL 3); and MBOT making uses, as a collector layer, of an organic semiconductor layer formed from a perylenetetracarboxylic acid diimide having long-chain alkyl groups (Japanese Patent Application 2009-114619).

As a vertical-type transistor, an organic transistor provided with a light-transmitting metal substrate has also been reported as a bipolar transistor. This organic transistor has organic semiconductor layers and a sheet-shaped base electrode between an emitter electrode and a collector electrode, and as the organic semiconductor layers, one being between the emitter electrode and the base electrode and the other between the collector electrode and the base electrode, uses hetero-junction organic semiconductor layers formed from N,N'-diphenyl-N,N'-di(1-naphthyl)-1,1'-biphenyl-4,4'-diamine (NPD) and fullerene (C60), respectively (NPL 1).

CITATION LIST

Patent Literature

PTL 1: JP-A-2003-101104
PTL 2: JP-A-2007-258308
PTL 3: JP-A-2009-272442

Non Patent Literature

NPL 1: J. Huang et al., Organic Electronics, Volume 10, Pages 210-213 (2009)

SUMMARY OF INVENTION

Technical Problem

It is, however, difficult to mass-fabricate vertical-type transistors of the polymer-grid triode structure or static induction transistors (SITs) with higher performance because of the difficulty in forming intermediate electrodes. The organic transistor devices (MBOTs) disclosed in Patent Citations 1 and 2 may provide a high off-state current depending on the film thickness and structure, and moreover, a current-amplifying effect is not necessarily observed on the above-described transistors even when a stacked structure of organic semiconductor/metal/organic semiconductor is formed. To show stable performance and to obtain a large current value, a high current amplification factor and a high on/off ratio, it is necessary to form an oxide layer, as an off-state current suppression layer, on a surface of a base electrode by heat treatment.

On the other hand, the organic transistor devices (MBOTs) disclosed in Patent Citation 3 and the earlier application (Japanese Patent Application 2009-114619) can amplify a current without applying heat treatment to an electrode for the formation of an off-state current suppression layer. They are, however, difficult to provide a large current value, large current amplification factor and high on/off ratio, which are sufficient to operate electronic equipment.

The organic transistor disclosed in NPL 1 and provided with the light-transmitting metal substrate may find utility in a complementary logic circuit or the like as it shows a current modulating effect as a bipolar transistor device. However, it has difficulty in providing a large current value, in other words, in increasing a current to such an extent as to operate electronic equipment, and therefore, can be hardly employed as a drive device in an organic EL display or the like.

The present invention has been made to resolve the above-described problem, and has as an object thereof the provision of a metal-base organic transistor device (MBOT), which exhibits a large current-amplifying effect at a low voltage between an emitter electrode and a collector electrode and is excellent in on/off ratio, by a simple fabrication process that does not require a treatment step such as heating. Another object of the present invention is to provide a light-emitting transistor device, which has an organic EL device portion including a light-emitting layer, can provide an excellent on/off ratio and a high current density, and can perform a self-emission.

Solution to Problem

The above-described objects can be achieved by the present invention to be described hereinafter. Described specifically, in one aspect of the present invention, there is provided a current-amplifying transistor device provided with an emitter electrode, a collector electrode, first and second organic semiconductor layers formed between the emitter electrode and collector electrode, and a sheet-shaped base electrode formed between the first organic semiconductor layer and the second organic semiconductor layer, wherein the first organic semiconductor layer is arranged between the emitter electrode and the base electrode, and has a diode structure of a p-type organic semiconductor layer and an n-type organic semiconductor layer. Owing to the adoption of the diode structure, the current-amplifying transistor device is excellent in on/off ratio, and can perform large-current amplification.

Preferably, the second organic semiconductor layer may comprise an n-type organic semiconductor layer arranged between the collector electrode and the base electrode, and the first organic semiconductor layer may have a diode structure of a p-type organic semiconductor layer formed above the base electrode and an n-type organic semiconductor layer formed below the emitter electrode.

The p-type organic semiconductor layer and n-type organic semiconductor layer in the first organic semiconductor layer may be, for example, a hole transport material layer and an electron transport material layer, respectively. The p-type organic semiconductor layer in the first organic semiconductor layer may be formed, for example, from a metal phthalocyanine or a non-metal phthalocyanine or from pentacene.

For example, the second organic semiconductor layer may be arranged between the collector electrode and the base electrode, and may comprise a stacked organic semiconductor layer obtainable by stacking an organic semiconductor layer, which is formed from N,N'-dimethylperylenetetracarboxylic acid diimide (Me-PTCDI), and another organic semiconductor layer, which is formed from fullerene (C60), together.

Preferably, the current-amplifying transistor device may further comprise a lithium fluoride layer formed between the base electrode and the second organic semiconductor layer.

The current-amplifying transistor device may have, for example, a current amplification factor of at least 50 at a low voltage not higher than 5 V. Further, the current-amplifying transistor device may have, for example, an on/off ratio of at least 100.

In another aspect of the present invention, there is also provided a current-amplifying, light-emitting transistor device comprising the above-described current-amplifying transistor device and an organic EL device portion formed between the p-type organic semiconductor layer and the n-type organic semiconductor layer in the first organic semiconductor layer, wherein the organic EL device portion comprises an organic light-emitting layer and at least one layer selected from the group consisting of a hole injection layer, a hole transport layer, an electron transport layer and an electron injection layer; or a current-amplifying, light-emitting transistor device comprising the above-described current-amplifying transistor device and an organic EL device portion formed between the second organic semiconductor layer and the collector electrode, wherein the organic EL device portion comprises an organic light-emitting layer and at least one layer selected from the group consisting of a hole injection layer, a hole transport layer, an electron transport layer and an electron injection layer.

Advantageous Effects of Invention

Owing to the inclusion of the diode structure in one of the organic semiconductor layers, the current-amplifying transistor device and current-amplifying, light-emitting transistor device according to the present invention can stably provide a current-amplifying effect that enables to perform, at a low voltage, amplification into a large current.

The current-amplifying transistor device (MBOT) according to the present invention is useful as a drive device for various displays, especially as a drive device for organic EL displays and electronic paper displays which are driven by large-current modulation. Transistor devices for driving these displays are needed to provide a high contrast between an off-state and an on-state so that a higher on/off ratio and suppression of a dark current are required. A low on/off ratio and a large dark current cause a problem such that an organic EL display may emit light even in an off-state. The current-amplifying transistor device according to the present invention is high in on/off ratio and is excellent in large-current modulation characteristics and frequency characteristics in a low voltage range, and therefore, can have high performance as a drive transistor device.

Further, the current-amplifying transistor device according to the present invention can perform large-current modulation in a low voltage range, can reduce the area occupied by a transistor device in a single pixel, and can provide a display with an improved aperture rate. As a consequence, a high-performance, high-efficiency display can be provided. The current-amplifying transistor device according to the present invention can be fabricated by a vapor deposition process. By forming such current-amplifying transistor devices on a flexible substrate of plastics or the like, a small-size, light-weight display or equipment can be manufactured.

The current-amplifying, light-emitting transistor device according to the present invention, which has the organic EL device portion formed between the p-type organic semiconductor layer and the n-type organic semiconductor layer in the first organic semiconductor layer or between the second organic semiconductor layer and the collector layer, can be fabricated in a form that an organic light-emitting device and its drive transistor device are combined into a single device. As the organic EL device portion has the organic light-emitting layer, a surface light emission is feasible from the electrode surfaces of such transistor devices. Moreover, no micro-patterning is needed for the base electrode unlike the conventional SIT structure, large-current modulation is feasible in a low voltage range, and a high on/off ratio is available. The current-amplifying, light-emitting transistor device is, therefore, excellent as a light-emitting transistor device. Because the current-amplifying, light-emitting transistor device can be fabricated by a vapor deposition process only, the device can be formed on a flexible substrate of plastics or the like. The current-amplifying, light-emitting transistor device can, therefore, be provided as a current-amplifying, light-emitting transistor device of a small-size, light-weight and simple structure. The current-amplifying transistor device and current-amplifying, light-emitting transistor device may hereinafter be called simply "transistor device and light-emitting transistor device" or "MBOT and light-emitting MBOT".

DESCRIPTION OF EMBODIMENTS

The present invention will hereinafter be described in detail based on certain embodiments of the present invention. It should, however, be borne in mind that the present invention shall not be limited to or by the following embodiments.

A description will first be made about a current-amplifying transistor device (MBOT) according to the one embodiment of the present invention, in which first and second organic semiconductor layers and a sheet-shaped base electrode are arranged between an emitter electrode and a collector electrode. As the first organic semiconductor layer, an emitter layer having a diode structure is used.

Figure 1:
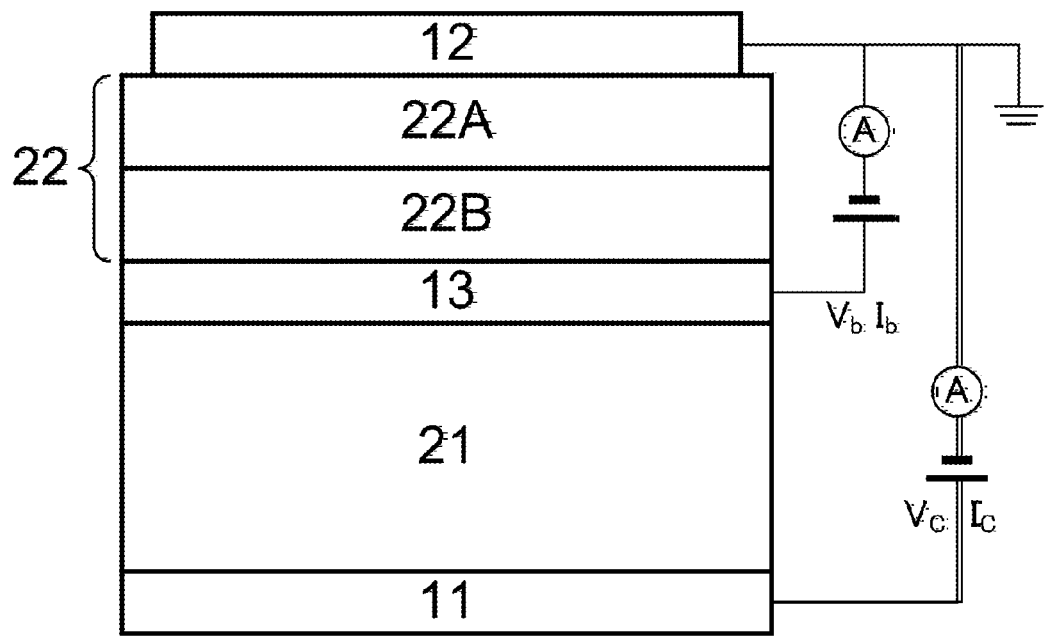
FIG. 1 is a simplified schematic cross-sectional view illustrating the construction of a transistor device according to one embodiment of the present invention and its drive circuit.

The transistor device of this embodiment is a vertical-type, metal-base, organic transistor device (MBOT), which as illustrated in FIG. 1, has a stacked structure of organic semiconductor/electrode/organic semiconductor and can be fabricated by a simple stacking process. Its structure includes, in an ascending order, a substrate (not shown in FIG. 1), a collector electrode 11, a collector layer (the second organic semiconductor layer) 21 formed of an organic semiconductor layer, a base electrode 13, an emitter layer (the first organic semiconductor layer) 22(22A,22B) having a stacked diode structure, and an emitter electrode 12.

For the fabrication of the transistor device of this embodiment, the collector electrode 11 and collector layer 21 are successively formed on the substrate, and further, the base electrode 13 and emitter layer 22(22A,22B) are stacked. Above the emitter layer 22, the emitter electrode 12 is formed further to provide the transistor device of this embodiment. The emitter layer 22 makes up a diode structure formed of an organic semiconductor layer 22A and an organic semiconductor layer 22B stacked together. Designated at signs 22A and 22B are specifically a combination of an n-type organic semiconductor layer and a p-type organic semiconductor layer. When the organic semiconductor layer 22A is the n-type organic semiconductor layer, the organic semiconductor layer 22B is formed as the p-type organic semiconductor layer. When the organic semiconductor layer 22A is the p-type organic semiconductor layer, on the other hand, the organic semiconductor layer 22B is formed as the n-type organic semiconductor layer. As to the construction of the emitter layer 22, signs 22A,22B designate the n-type organic semiconductor layer and the p-type organic semiconductor layer, respectively, when the collector layer 21 is formed as an n-type organic semiconductor layer, or indicate the p-type organic semiconductor layer and the n-type organic semiconductor layer, respectively, when the collector layer 21 is formed as a p-type organic semiconductor layer.

As the diode structure in the transistor device of this embodiment, the emitter layer 22 has the diode structure formed of the p-type organic semiconductor layer and the n-type organic semiconductor layer. Owing to the effect of this diode structure, the transistor device of this embodiment has effects to increase a base current and a collector current and also to suppress a dark current and hence to maintain an off-state current small. The transistor device of this embodiment is, therefore, useful as an organic transistor device (MBOT) that can perform large output modulation and large-current amplification in a low voltage range.

A description will next be made about a current that flows through the transistor device of this embodiment. When a collector voltage Vc is applied between the emitter electrode 12 and the collector electrode 11 and a base voltage Vb is applied between the emitter electrode 12 and the base electrode 13, electrons injected from the emitter electrode 12 are accelerated under the action of the base voltage, and therefore, pass through the base electrode 13 and reach the collector electrode 11. In other words, a base current Ib, which flows upon application of the base voltage Vb between the emitter electrode 12 and the base electrode 13, is amplified into a collector current Ic that by the application of the base voltage, flows between the emitter electrode 12 and the collector electrode 11. Therefore, the transistor device of this embodiment can stably bring about a similar current-amplifying effect as a bipolar transistor device, and can perform large output modulation and current amplification.

For example, MBOT with a diode structure formed of an n-type semiconductor layer (fullerene) and a p-type semiconductor layer (copper phthalocyanine) can provide, as a current Ic, a large current approximately 10 times or more compared with a current Ic available from the use of a single n-type organic semiconductor (fullerene). Although its principle is not clear, it may presumably be possible to consider the following mechanism: [1] the current amplification factor is significantly improved, [2] owing to the introduction of the light-emitting layer in the layer of the diode structure, an emission of light is feasible as a result of recombination of holes and electrons, [3] because the off-state current does not increase, electrons flow from around the base electrode toward the collector, a hole current is produced toward the emitter layer, and the current pass rate through the base electrode is also improved. Owing to the rectification effect of the diode structure, the off-state current is suppressed, and a current of electrons and a current of holes flow between the emitter electrode and the base electrode with the diode layer interposed therebetween. As a result, the diode structure is considered to enable larger current amplification than the single layer.

Owing to the diode structure, the organic transistor device (MBOT) of this embodiment can effectively suppress a leakage current, which is not needed for the operation of the transistor device and may also be called "an off-state current" or "a dark current" that flows in a switch-off state, from flowing between the base electrode and the collector electrode when no voltage Vb (Vb=0 V) is applied between the emitter electrode and the base electrode. As a result, the organic transistor device of this embodiment is provided with an improved on/off ratio. When organic transistor devices (MBOT) are employed as drive transistor devices in an organic EL display, large dark currents cause emissions of light from the organic EL devices even when they are switched off. These emissions of light lead to a reduction in the contrast between an on-state and an off-state. It is, therefore, required for a drive transistor device to have a high on/off ratio, preferably an on/off ratio of 10 or higher, with an on/off ratio of 100 or higher being more preferred.

The transistor device (MBOT) of this embodiment has the diode structure between the emitter electrode and the base electrode. In an off-state, substantially no current (off-state current) is, therefore, allowed to flow from the base electrode to the emitter electrode owing to the rectification effect of the diode structure. A dark current that flows in an off-state is, therefore, suppressed so that a high on/off ratio is obtained.

Even in a low voltage range, the transistor device (MBOT) of this embodiment can show a large current amplification effect and can obtain a large current. In general, an organic EL device is driven in a low voltage range, so that its drive transistor device is required to output a large current at several volts. If a voltage to be applied is set high, an organic EL device can obtain a large current and can realize an emission of high-intensity light. However, such a high voltage induces deterioration or degradation of the materials of the organic EL device, so that the organic EL device is shortened in service life and cannot perform stable emissions of light over a long term. Therefore, the drive voltage may range from 1 to 20 V, with 5 V or lower being preferred. The current value to be obtained as a result of amplification by the transistor device in this low voltage range may range preferably from 10 mA/cm$^2$ to 500 mA/cm$^2$, more preferably from 20 mA/cm$^2$ to 200 mA/cm$^2$. A current value smaller than 10 mA/cm$^2$ cannot allow the organic EL device to emit sufficient light, so that no sufficient emission intensity can be obtained. A current value greater than 500 mA/cm$^2$, on the other hand, cannot provide a sufficient on/off ratio, leading to a potential problem that even in an off-state (voltage: 0 V), a dark current may be produced and light may be emitted from the organic EL device.

The emitter layer in the transistor device of this embodiment has the diode structure of the p-type organic semiconductor layer and the n-type organic semiconductor layer stacked together. Any material can be used to form the emitter layer of the stacked structure insofar as the emitter layer can function as a diode. A combination of a p-type organic semiconductor material and an n-type organic semiconductor material can be used without problem. The organic semiconductor material used in the p-type organic semiconductor layer functions as a hole-transporting semiconductor. Any material can be used without any particular limitation insofar as it is a material that can transport holes (hole transport material). On the other hand, the organic semiconductor material used in the n-type organic semiconductor layer functions as an electron-transporting semiconductor. Any material can be used without any limitation insofar as it is a material that can transport electrons (electron transport material).

The construction of the emitter layer in the transistor device of this embodiment is determined depending on whether the collector layer interposed between the base electrode and the collector electrode is an n-type organic semiconductor layer or a p-type organic semiconductor layer. When the collector layer is formed from an n-type organic semiconductor material, the p-type semiconductor layer is formed on the base electrode and the n-type semiconductor layer is formed below the emitter electrode. When the collector layer is formed from a p-type semiconductor material, on the other hand, an n-type semiconductor layer is formed on the base electrode and a p-type semiconductor layer is formed below the emitter electrode. As a particularly preferred embodiment, it is possible to mention an organic transistor device (MBOT) in which in view of the energy levels of the used electrodes and the HOMO and LUMO energy levels of the organic semiconductor layers, a collector layer is formed of an n-type organic semiconductor layer, a p-type organic semiconductor layer is formed on the base electrode, and further, an n-type organic semiconductor layer is stacked to form an emitter electrode.

The current-amplifying, light-emitting transistor device according to the present invention requires no micropatterning for the base electrode unlike the conventional SIT structure, can perform large-current modulation at a low voltage, and is high in on/off ratio. Further, the current-amplifying, light-emitting transistor device can be fabricated by a vapor deposition process only, can also be formed on a flexible substrate of plastics or the like and has a small-size, light-weight and simple structure, and therefore, is practical.

(Light-Emitting Transistor Device A)

By forming a light-emitting layer in the emitter layer of the transistor device (MBOT) of this embodiment, an emission of light occurs as a result of deactivation of excitons formed by recombination between holes associated with a hole current from the base electrode and electrons from the emitter electrode. The transistor device of this embodiment can, therefore, be used as a light-emitting transistor device A. Any light-emitting layer can be used without any problem insofar as it is formed from a light-emitting material employed in organic EL devices. The light-emitting layer can be formed between the p-type semiconductor layer and the n-type semiconductor layer. When the n-type semiconductor layer or p-type semiconductor layer is formed from a light-emitting, organic semiconductor material, the organic semiconductor layer can also serve as the light-emitting layer so that no additional light-emitting layer needs to be formed. To obtain an improved luminous efficiency, an electron injection layer, a hole injection layer and an exciton blocking layer may be formed.

(Light-Emitting Transistor Device B)

A light-emitting transistor device B is provided when in the transistor device of this embodiment, the collector layer has, as an organic EL device portion, a light-emitting device portion including a light-emitting layer and the light-emitting device portion comprises one or more layers selected from a hole injection layer, a hole transport layer, an electron transport layer and an electron injection layer.

A description will next be made about the structures and materials of the individual elements in the transistor device of this embodiment.

(Substrate)

No particular limitation is imposed on the material of the substrate that forms the organic transistor device of this embodiment, insofar as it can retain the configuration of the transistor device. Usable examples include inorganic materials such as glass, alumina, silica and silicon carbide, metal materials such as aluminum, copper and gold, and plastics such as polyimides, polyesters, polyethylene, polystyrene, polypropylene, polycarbonates and polymethyl methacrylate. The use of a plastic substrate makes it possible to fabricate a transistor device which is light in weight, is excellent in impact resistance, and is flexible. When desired to use the transistor device as a light-emitting transistor device which has an organic light-emitting layer formed therein and is of the bottom emission type that light is released from the side of the substrate, the use of a substrate having high optical transparency, such as a plastic film or glass substrate, is desired. These substrates may be used either singly or in combination. No particular limitation is on the size and form of the substrate insofar as the formation of the transistor device is feasible. For example, a substrate of any desired form such as a card, film, disk or chip can be used without any problem.

(Organic Semiconductor Layer)

The organic semiconductor layer that forms the organic transistor device of this embodiment is characterized in that as illustrated in FIG. 1, it comprises the collector layer 21 arranged between the collector electrode 11 and the base electrode 13 and the emitter layer 22 formed between the base electrode 13 and the emitter layer 12, and the emitter layer 22(22A,22B) has the diode structure in the form of the stacked structure of the n-type semiconductor layer and p-type semiconductor layer.

(Emitter Layer)

As the emitter layer in this embodiment, the organic semiconductor layer 22(22A,22B) arranged between the emitter electrode and the base electrode has the diode structure formed of the p-type organic semiconductor layer and n-type organic semiconductor. The construction of the diode structure can be selectively determined depending on the organic semiconductor materials to be used for the emitter layer and collector layer, respectively. When the collector layer is formed from an n-type organic semiconductor layer, the emitter layer may desirably be formed by stacking the p-type organic semiconductor layer on the base electrode and further, the n-type organic semiconductor layer on the p-type organic semiconductor layer. When the collector layer is formed from a p-type organic semiconductor layer, on the other hand, the emitter layer may desirably be formed by stacking the n-type organic semiconductor layer on the base electrode and further, the p-type organic semiconductor layer on the n-type organic semiconductor layer.

The p-type organic semiconductor layer used in the emitter layer in this embodiment has a function that it receives holes from the base electrode or emitter electrode and transports them to its counterpart n-type organic semiconductor layer or to a vicinity of its interface with the its counterpart n-type organic semiconductor layer. Any desired material can be used as a material for forming the p-type organic semiconductor layer without any particular limitation insofar as it is a common p-type semiconductor material. Usable examples include pentacene, non-metal phthalocyanine, metal phthalocyanines (Cu-Pc, VO-Pc, Ni-Pc, and so on), naphthalocyanine, indigo, thioindigo, anthracene, quinacridone, oxadiazole, triphenylamine, triazole, imidazole, imidazolone, pyrazoline, tetrahydroimidazole, polythiophene, porphyrin, and naphthothiophene, and their derivatives. In addition to the p-type organic semiconductor material, a hole transport material can also be used as a p-type organic semiconductor material.

Examples of the hole transport material include poly(N-vinylcarbazole), polysilane, polyaniline, polypyrrole, poly(p-phenylenevinylene), thiophene-fluorene copolymer, phenylene-vinylene copolymer, and their derivatives. As a specific example, poly(3,4-ethylenedioxythiophene)/polystyrene sulfonate (abbreviation: PEDOT/PSS, trade name: "CLEVIOS P" (product of H.C. Starck Clevis GmbH) can be used.

The p-type semiconductor material that forms the emitter layer in this embodiment may preferably have electrical stability and adequate ionization potential and electron affinity. Particularly preferred materials include pentacene, and phthalocyanines such as copper phthalocyanine and non-metal phthalocyanines, as p-type semiconductor materials; and PDOT/PSS as a hole transport material.

Material other than those described above may also be used as the p-type semiconductor material provided that they have higher transport capability for holes than for electrons. The p-type semiconductor layer may have not only a single layer structure making use of a single p-type semiconductor material but also a mixed layer structure formed from two or more p-type semiconductor materials or a stacked structure formed of two or more organic semiconductor layers of different p-type semiconductor materials. The p-type organic semiconductor layer can be formed by a vapor deposition process or by one of various printing or coating processes that make use of a solution or dispersion containing the above-described p-type semiconductor material.

The n-type organic semiconductor layer employed in the emitter layer in this embodiment has a function that it receives electrons from the base electrode or emitter electrode and transports them to its counterpart p-type organic semiconductor layer or to a vicinity of its interface with the its counterpart p-type organic semiconductor layer. The n-type organic semiconductor material that forms the n-type organic semiconductor layer may preferably have electrical stability and adequate ionization potential and electron affinity. Any desired material can be used as a material for forming the n-type organic semiconductor layer without any particular limitation insofar as it is a common n-type semiconductor material. Examples of the n-type semiconductor material for use in the emitter layer include $Alq_3$ (tris(8-hydroxyquinolinol)aluminum) complex), naphthalene tetracarboxylic anhydride (NTCDA), dialkylnaphthalenetetracarboxylic anhydride diimides (NTCDI), perylene, perylenetetracarboxylic anhydride (PTCDA), dialkylperylenetetracarboxylic diimides (PTCDI), perylenebisbenzoimidazole (PTCBI), dialkylanthraquinones, fluorenylidenemethane, tetracyanoethylene, fluorenone, diphenoquinone oxadiazole, anthrone, thiopyran dioxide, diphenoquinone, benzoquinone, malononitrile, dinitrobenzene, nitroanthraquinone, pyridine, pyrimidine, maleic anhydride, pentacene fluoride, phthalocyanine fluoride, alkyloligothiophene fluorides, fullerenes, carbon nanotube and carbon nanohorn, and their derivatives. Particularly preferred materials include fullerenes represented by C60 and perylenetetracarboxylic acid derivatives represented by dimethylperylenetetracarboxylic diimide (Me-PTCDI).

For the n-type organic semiconductor material for forming the emitter layer in this embodiment, the parameter value that indicates its ionization potential is generally important. Materials other than those described above may also be used as the n-type semiconductor layer provided that they have higher transport capability for holes than for electrons. The n-type semiconductor layer may have not only a single layer structure making use of a single n-type semiconductor material but also a mixed layer structure formed from two or more n-type semiconductor materials or a stacked structure formed of two or more organic semiconductor layers of different n-type semiconductor materials. The n-type organic semiconductor layer can be formed by a vapor deposition process or by a coating process that makes use of a coating formulation containing the above-described n-type semiconductor material.

Although the emitter layer in this embodiment can be formed by using an n-type organic semiconductor material of a single chemical structure and a p-type organic semiconductor material of a single chemical structure, the n-type organic semiconductor material may be mixed with an electron transport material of a different chemical structure and the p-type organic semiconductor material may be mixed with a hole transport material of a different chemical structure. These n-type organic semiconductor material and p-type organic semiconductor material are stacked to form an n-type organic semiconductor layer and a p-type organic semiconductor layer joined together such that an emitter layer is formed as a diode structure. As a particularly preferred combination of materials, it is possible to mention fullerene (C60) as the n-type organic semiconductor layer and copper phthalocyanine or pentacene as the p-type organic semiconductor layer. The emitter layer 22 as an organic semiconductor layer may desirably be formed by stacking the p-type organic semiconductor layer 22A and the n-type organic semiconductor layer 22B on the base electrode 13, although the emitter layer 22 can be used without any particular problem insofar as it has a diode structure.

The organic semiconductor layer that makes up the emitter layer in this embodiment may desirably have a high charge mobility, with at least 0.0001 $cm^2/V \cdot s$ being preferred.

The thicknesses of the emitter layers 22A,22B may preferably be smaller than the collector layer in principle, and can each be 300 nm or smaller, preferably from 5 nm to 300 nm or so. If the thickness of the emitter layer is smaller than 10 nm, the diode structure may not be formed locally. As a consequence, some transistor devices may involve a problem of reduced performance or a conduction failure, leading to a reduction in fabrication yield. A thickness greater than 300 nm, on the other hand, may develop a problem of high fabrication cost and material cost.

(Collector Layer)

From an organic semiconductor material, the collector layer in this embodiment is formed between the base electrode and the collector electrode. The material usable for the formation of the collector layer can be an n-type organic semiconductor material or p-type organic semiconductor material that is commonly employed as an organic semiconductor material. No particular limitation is imposed on the n-type organic semiconductor material insofar as it can transport electrons, and therefore, a common n-type organic semiconductor material can be used. Likewise, no particular limitation is imposed on the p-type organic semiconductor material insofar as it can transport holes, and therefore, a common p-type organic semiconductor material can be used. For example, the above-described n-type semiconductor material (electron transport material) or p-type semiconductor material (hole transport material) for use in the emitter layer can be used. In the collector layer, it is also possible to use one or more of the materials for forming the light-emitting layer, which will be described subsequently in the description of the light-emitting transistor devices according to the present invention.

As the material for forming the collector layer in this embodiment, any desired material can be used without any particular limitation insofar as it is an n-type organic semiconductor material or p-type organic semiconductor material. It is desired to form the collector layer with alkyl-containing PTCDI or fullerene (C60), which is an n-type organic semiconductor material. The collector layer may use a material that is commonly employed as a charge transport material. Although an n-type semiconductor material or p-type semiconductor material can be used singly, the collector layer may also have a mixed layer structure formed from two or more n-type semiconductor materials or p-type semiconductor materials or a stacked structure formed of organic semiconductor layers of two or more n-type semiconductor materials or p-type semiconductor materials.

As a particularly preferred form, it is possible to mention a stacked collector layer obtainable by forming on the collector layer an organic semiconductor layer from Me-PTCDI and then forming another organic semiconductor layer from C60. The organic semiconductor layer of C60 arranged below the base electrode can form an energy barrier to block an off-state current.

When a semiconductor layer formed from Me-PTCDI or fullerene is used as the collector layer, the surface of the semiconductor layer 21, on which the base electrode 13 is to be formed, becomes rough because the alkyl-containing PTCDI or fullerene is an organic compound having high crystallinity. Therefore, the base electrode 13 arranged on the semiconductor layer of the organic semiconductor material of high crystallinity is also provided with a rough surface. The base electrode having the rough surface includes thinner portions and thicker portions even when it is formed with a predetermined average thickness. When the base electrode 13 is provided with such a rough surface, a current amplifying effect can be stably obtained in particular.

The thickness of the collector layer in this embodiment may be generally from 50 nm to 5,000 nm, preferably from 100 nm to 500 nm or so. A thickness smaller than 50 nm may lead to inoperability as a transistor device, while a thickness greater than 5,000 nm may result in a problem of high fabrication cost and material cost. The collector layer may desirably have a high charge mobility, with at least 0.0001 $cm^2/V \cdot s$ being desired. A low charge mobility develops a problem such as reducing its performance as a transistor device, for example, lowering its on-state current.

(Electrodes)

A description will now be made about the electrodes used in the transistor device of this embodiment. As the electrodes that make up the transistor device of this embodiment, there are the collector electrode 11, emitter electrode 12 and base electrode 13. As illustrated in FIG. 1, the collector electrode 11 is generally arranged on a substrate (not shown), the base electrode 13 is generally arranged such that it is embedded between the semiconductor layers 21 and 22, and the emitter electrode 12 is generally arranged on a side opposite the collector electrode 11 such that the semiconductor layers 21,22 and the base electrode 13 are interposed between the emitter electrode 12 and the collector electrode 11.

The materials to be used for the electrodes in the transistor device of this embodiment will next be described. When the collector layer 21 making up the transistor device of this embodiment is, for example, an n-type semiconductor layer formed from an organic compound, examples of a material that forms the collector electrode 11 include transparent conductive oxides such as ITO (indium tin oxide), indium oxide, IZO (indium zinc oxide), $SnO_2$ and ZnO, metals having large work functions such as gold and chromium, and conductive high-molecular materials such as polyaniline, polyacetylene, polyalkylthiophene derivatives and polysilane derivatives. Illustrative of a material that forms the emitter electrode 12 are metals having small work functions, for example, simple metals such as aluminum and silver, magnesium alloys such as Mg/Ag, aluminum alloys such as Al/Li, Al/Ca and Al/Mg, alkali metals led by Li, alkaline earth metals led by Ca, and alloys of these alkali metals and alkaline earth metals. When the collector layer 21 making up the transistor device of this embodiment is a hole transport layer formed from an organic compound, on the other hand, the above-described forming material of the collector electrode 11 and the above-described forming material of the emitter electrode 12 are reversed.

As the base electrode 13 forms a Schottky contact with the material that makes up the organic semiconductor layer, the materials usable for the collector electrode 11 and emitter electrode 12 can also be mentioned as materials for the base electrode. Although not specifically limited, preferred base electrode materials include metal-containing materials having small work functions, for example, simple metals such as aluminum and silver, magnesium alloys such as Mg/Ag, aluminum alloys such as Al/Li, Al/Ca and Al/Mg, alkali metals led by Li, alkaline earth metals led by Ca, and compounds of these alkali metals and alkaline earth metals, such as Li/F. Transparent conductive oxides such as ITO (indium tin oxide), indium oxide, IZO (indium zinc oxide), $SnO_2$ and ZnO, metals having large work functions such as gold and chromium, and conductive high-molecular materials such as polyaniline, polyacetylene, polyalkylthiophene derivatives and polysilane derivatives can also be used provided that they can form a Schottky contact with the charge (hole or electron) injection layer.

When the collector layer 21 is formed by vacuum deposition of the above-described organic compound of high crystallinity, the surface of the collector layer 21, on which the base electrode 13 is to be formed, is rough as mentioned above. The base electrode 13 arranged on the crystalline collector layer 21 is also provided with a rough surface. The base electrode 13 having the rough surface includes thinner portions and thicker portions even when it is formed with a predetermined average thickness. According to the present invention, a current amplifying effect can be stably obtained when the base electrode 13 is provided with such a rough surface.

As a base electrode for suppressing a dark current in an off-state and achieving a high on/off ratio, it is preferred to use a base electrode with an oxide film formed on an electrode surface by forming an electrode from aluminum or an aluminum/calcium alloy and then subjecting it to thermal oxidation treatment in air. Further, the use of a layered structure formed of an aluminum layer and a lithium fluoride layer as a base electrode makes it possible to form a transistor device capable of providing a large on-state current, suppressing a dark current and achieving a high on/off ratio.

When it is desired to use the below-described light-emitting transistor device of the present invention as an organic, light-emitting transistor device of the bottom emission structure that outputs light from the side of the substrate, at least the collector electrode 11 may preferably be formed from a transparent or half-transparent material. When it is desired to fabricate an organic, light-emitting transistor device of the top emission structure that outputs light from the side of the emitter electrode 12, on the other hand, the base electrode 13 and emitter electrode 12 may preferably be formed from a transparent or half-transparent material. As the transparent or half-transparent electrode material capable of providing an improved efficiency of light output by such a construction, a transparent conductive oxide such as ITO (indium tin oxide), indium oxide, IZO (indium zinc oxide), $SnO_2$ or ZnO can be used.

The thickness of the base electrode 13 employed in the transistor device of this embodiment may preferably be from 0.5 nm to 100 nm. When the thickness of the base electrode 13 is 100 nm or smaller, electrons accelerated at the base voltage Vb are allowed to easily pass. The base electrode 13 can be used without any problem insofar as it is arranged without any interruption (without any defect such as a pit or fracture). A thickness smaller than 0.5 nm, on the other hand, may produce a defect so that the resulting transistor device may not operate as an organic transistor device.

A description will next be made about a process for forming the electrodes in the transistor device of this embodiment. The collector electrode 11 and emitter electrode 12 out of the above-described respective electrodes may preferably be formed by a vacuum process such as vacuum deposition, sputtering or CVD or a coating process, and their thicknesses may be, for example, from 10 nm to 1,000 nm or so although the thicknesses vary depending on the materials to be used. A thickness smaller than 10 nm may lead to inoperability as a transistor device, while a thickness greater than 1,000 nm may result in a problem of high fabrication cost and material cost. On the other hand, the base electrode 13 may also be formed preferably by a vacuum process such as vacuum deposition, sputtering or CVD or a coating process, and its thickness may be, for example, from 0.5 nm to 100 nm as described above although the thickness varies depending on the material to be used.

(Dark-Current Suppression Layer)

In the transistor device of this embodiment, a dark-current suppression layer may be formed to suppress a dark current. The dark-current suppression layer may preferably be formed by subjecting the base electrode 13 to heat treatment after its formation. Further, a dark current, which flows through the transistor device of this embodiment when the voltage Vb is not applied between the emitter electrode 12 and the base electrode 13, can be effectively suppressed by forming the base electrode 13 from a metal and forming an oxide film of the metal on one side or both sides of the base electrode 13.

Owing to the arrangement of the dark-current suppression layer between the collector electrode 11 and the base electrode 13 as described above, it is possible to effectively suppress a dark current from flowing. As a result, the on/off ratio can be improved further. As readily appreciated from the foregoing, the transistor device of this embodiment apparently functions as an efficient current-amplifying transistor device like a bipolar transistor device, and functions as an excellent organic transistor device capable of bringing about a high on/off ratio, a large collector current and a current amplification factor.

(Light-Emitting Transistor Devices)

Light-emitting transistor devices according to the present invention include the light-emitting transistor device A having a light-emitting layer in the emitter layer 22 of the transistor device (MBOT) and the light-emitting transistor device B having a light-emitting layer in the collector layer 21 of the transistor device (MBOT).

Figure 2:
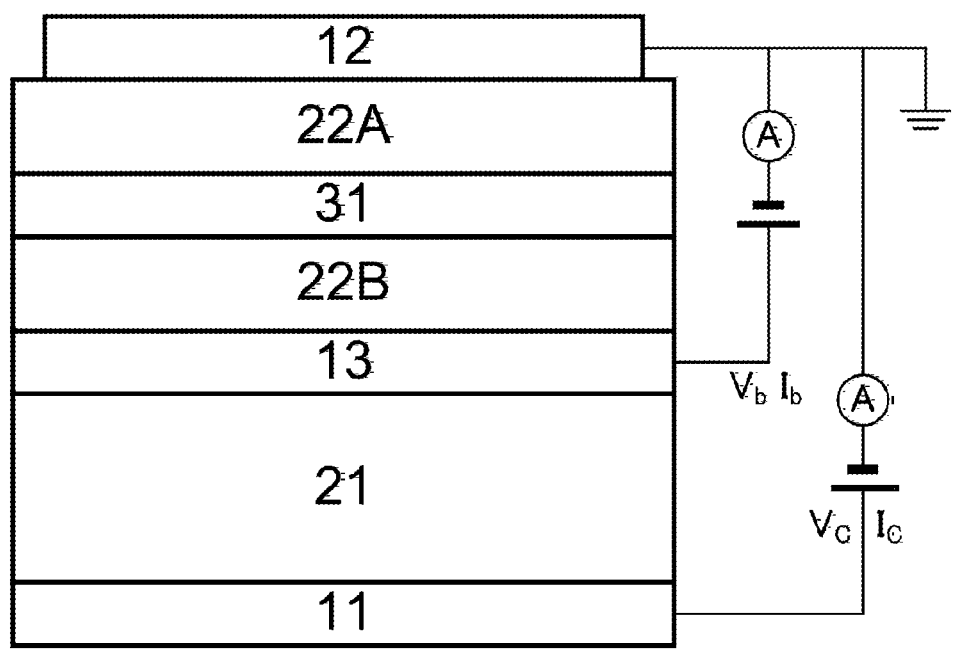
FIG. 2 is a simplified schematic cross-sectional view illustrating the construction of a light-emitting transistor device A according to another embodiment of the present invention and its drive circuit.

As illustrated in FIG. 2, the light-emitting transistor device A according to the present invention has an organic EL device portion 31 between a base electrode 13 and an emitter electrode 12 in a transistor device (MBOT) according to the present invention, and the organic EL device portion 31 may comprise an organic light-emitting layer and, if necessary or preferred, one or more layers selected from the group consisting of a hole injection layer, a hole transport layer, an electron transport layer and an electron injection layer.

Figure 3:
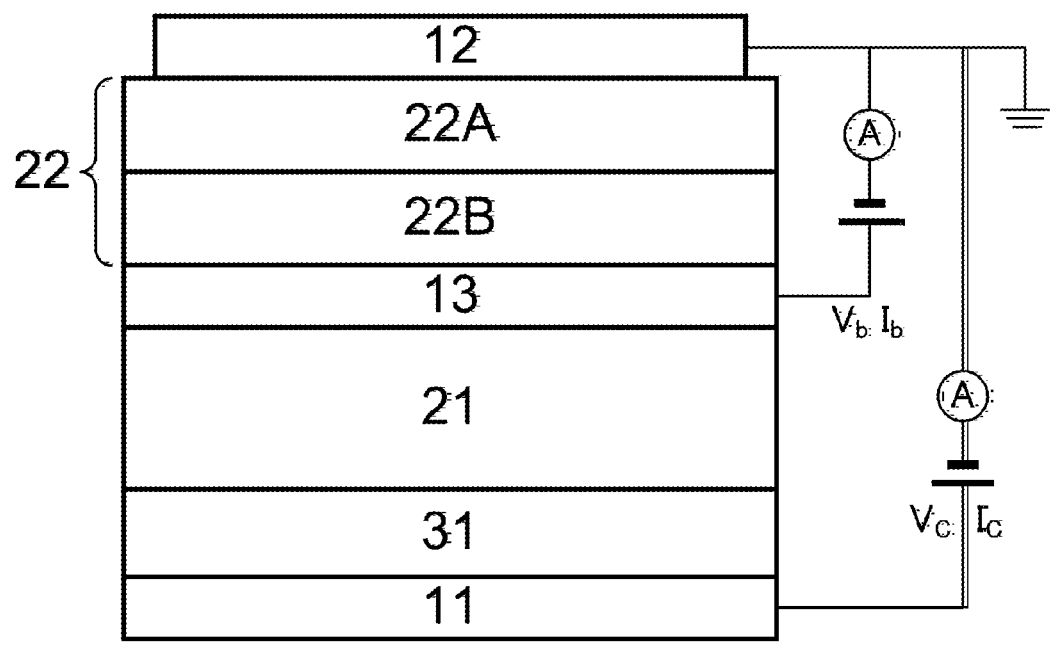
FIG. 3 is a simplified schematic cross-sectional view illustrating the construction of a light-emitting transistor device B according to a further embodiment of the present invention and its drive circuit.

As illustrated in FIG. 3, on the other hand, the light-emitting transistor device B according to the present invention has an organic EL device portion 31 between a base electrode 13 and a collector electrode 11 in a transistor device (MBOT) according to the present invention, and the organic EL device portion 31 may comprise an organic light-emitting layer and, if necessary or preferred, one or more layers selected from the group consisting of a hole injection layer, a hole transport layer, an electron transport layer and an electron injection layer.

(Light-Emitting Transistor Device A)

By forming the organic EL device portion 31 in the emitter layer 22 of the transistor device (MBOT) of according to the present invention, an emission of light occurs as a result of deactivation of excitons formed by recombination between holes associated with a hole current from the base electrode 13 and electrons from the emitter electrode. The transistor device of this embodiment can, therefore, be used as a light-emitting transistor device A. The light-emitting layer can be used without any problem insofar as it is formed from a light-emitting material employed in organic EL devices. The light-emitting layer can be formed between the p-type organic semiconductor layer and the n-type organic semiconductor layer. When the n-type organic semiconductor layer or p-type organic semiconductor layer is formed from a light-emitting, organic semiconductor material, the organic semiconductor layer can also serve as the light-emitting layer so that no additional light-emitting layer needs to be formed. To obtain an improved luminous efficiency, an electron injection layer and a hole injection layer may be formed.

As illustrated in FIG. 2, the structure of the light-emitting transistor device A is characterized in that it has the organic EL device portion 31 between the base electrode 13 and the emitter electrode 12 and the organic EL device portion 31 includes the organic light-emitting layer and, if necessary or preferred, one or more layers selected from the group consisting of a hole injection layer, a hole transport layer, an electron transport layer and an electron injection layer. As the organic EL device portion 31 includes at least one light-emitting layer, an emission of light by a large current is feasible. No micropatterning is needed for the base electrode unlike the conventional SIT structure, large-current modulation is feasible at a low voltage, and further, an improved on/off ratio is available. The light-emitting transistor device A can, therefore, be provided as a practical light-emitting transistor device having a simple structure.

(Light-Emitting Transistor Device B)

As depicted in FIG. 3, the light-emitting organic transistor device B according to the present invention has the organic EL device portion 31 between the base electrode 13 and the collector electrode 11, the organic EL device portion includes the organic light-emitting layer and one or more layers selected from the group consisting of a hole injection layer, a hole transport layer, an electron transport layer and an electron injection layer. The organic light-emitting transistor device B can, therefore, be provided as a light-emitting transistor device, which includes the organic EL device portion and its drive transistor in combination, requires no micropatterning for the base electrode unlike the conventional SIT structure, can perform large-current modulation, is high in emission brightness, excellent in contrast and superb in frequency characteristics owing to a high on/off ratio, and can perform a self-emission. The light-emitting organic transistor device B can be fabricated by a vapor deposition process only, can be formed on a flexible substrate of plastics or the like, and therefore, can be provided as a light-transmitting transistor device having a small-size, light-weight and simple structure and high practical utility.

As illustrated in FIG. 3, the structure of the light-emitting transistor device B according to the present invention has the organic EL device portion 31 between the base electrode 13 and the collector electrode 11, and the organic EL device portion 31 includes at least one light-emitting layer. The light-emitting transistor device B can, therefore, perform a surface light emission. No micropatterning is needed for the base electrode unlike the conventional SIT structure, large-current modulation is feasible at a low voltage, and an improved on/off ratio is available. The light-emitting transistor device B can, therefore, be provided as a light-transmitting transistor device having a simple structure and high practical utility. As the emitter layer in the light-emitting transistor device B is an n-type semiconductor layer formed from an electron transport material, no electron transport layer is specifically arranged. However, an electron transport layer may be arranged on the side of the base electrode 13 relative to the organic EL device portion 31 as needed.

(Organic EL Device Portion)

Figure 4:
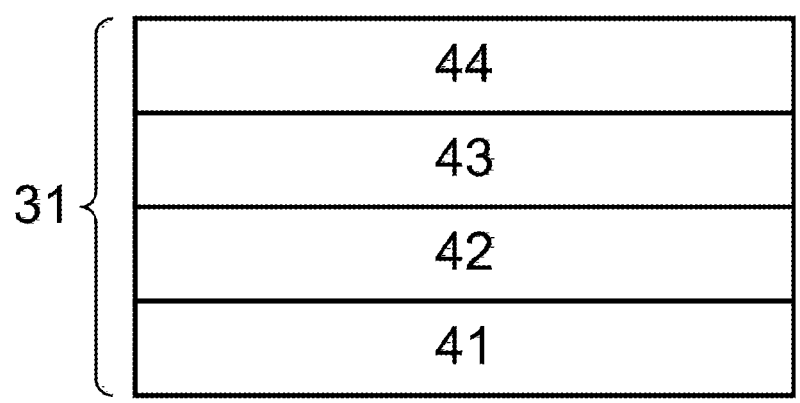
FIG. 4 is a simplified schematic cross-sectional view illustrating the construction of an EL device portion in the light-emitting transistor device A or B.

An organic EL device portion 31, which is shown in FIG. 4 and is usable in the light-emitting transistor device A, is provided, in an ascending order from the side of an electrode as a positive electrode (from the side of the base electrode), with a hole injection layer 41, a hole transport layer 42 and a light-emitting layer 43. An exciton blocking layer 44 is arranged on the side of the emitter electrode 12 (see FIG. 2) relative to the light-emitting layer 43. Below the emitter electrode 12, an electron transport layer composed of an n-type organic semiconductor layer 22A (see FIG. 2) is formed. As numerous charges are accelerated to reach the light-emitting layer 43 of the organic EL device portion 31 in this light-emitting transistor device A, the injection of charges from the emitter electrode 12 is easy. The organic EL device portion 31, therefore, has a merit that it does not necessarily require a charge injection layer. There is, accordingly, an advantageous effect that an alkali metal, which facilitates the injection of electrons but is prone to oxidation, needs not to be used as a negative electrode unlike conventional organic EL device portions. An organic EL device portion 31 (see FIG. 3) which is usable in the light-emitting transistor device B has a construction reversed upside down from the construction shown in FIG. 4, with a need for replacement of "hole" by "electron". Described specifically, an exciton blocking layer, a light-emitting layer, an electron transport layer and an electron injection layer are stacked in this order from the collector electrode 11 toward the base electrode 13 (see FIG. 3). As numerous charges are accelerated to reach the light-emitting layer of the organic EL device portion 31 in this light-emitting transistor device B, the injection of electrons from the collector electrode 11 is easy. The organic EL device portion 31, therefore, has a merit that it does not necessarily require a charge injection layer.

No particular limitation is imposed on the forming material of the light-emitting layer 43 employed in the organic EL device portion 31 in the present invention, insofar as it is a material commonly employed as a light-emitting layer in an organic EL device. Examples include dye-based light-emitting materials, metal-complex-based light-emitting materials, and high molecular light-emitting materials.

Illustrative of the dye-based light-emitting materials are cyclopentadiene derivatives, tetraphenylbutadiene derivatives, triphenylamine derivatives, oxadiazole derivatives, pyrazoloquinoline derivatives, distyrylbenzene derivatives, distyrylarylene derivatives, silol derivatives, thiophene ring compounds, pyridine ring compounds, perinone derivatives, perylene derivatives, oligothiophene derivatives, trifumanylamine derivatives, oxadiazole dimer, and pyrazoline dimer.

Illustrative of the metal-complex-based light-emitting materials are metal complexes each having Al, Zn, Be or the like or a rare earth metal such as Tb, Eu or Dy, as a center metal, and an oxadiazole, thiadiazole, phenylpyridine, phenylbenzoimidazole, quinoline or like structure as a ligand, such as aluminum-quinolinol complexes, benzoquinolinol-beryllium complexes, benzoxazole-zinc complexes, benzothiazole-zinc complexes, azomethyl-zinc complexes, porphyrin-zinc complexes, and phenanthroline-europium complexes.

Illustrative of the high molecular light-emitting materials are polyparaphenylene vinylene derivatives, polythiophene derivatives, polyparaphenylene derivatives, polysilane derivatives, polyacetylene derivatives, polyvinylcarbazole derivatives, polyfluorenone derivatives, polyfluorene derivatives and polyquinoxaline derivatives, and their copolymers.

In the light-emitting layer 43, an additive such as a dopant may be added, for example, to improve the luminous efficiency or to change the luminous wavelength. Examples of the dopant include perylene derivatives, coumarin derivatives, rubrene derivatives, quinacridone derivatives, squarylium derivatives, porphyrin derivatives, styryl dyes, tetracene derivatives, pyrazoline derivatives, decacyclene derivatives, phenoxazone derivatives, quinoxaline derivatives, carbazole derivatives, and fluorene derivatives.

Examples of the forming material of the hole injection layer 41 employed in the organic EL device portion 31 in the present invention include, in addition to the compounds exemplified above as light-emitting materials for the light-emitting layer 43, phenylamine derivatives, starburst amine derivatives, phthalocyanine derivatives, oxides such as vanadium oxide, molybdenum oxide, ruthenium oxide and aluminum oxide, amorphous carbon, and derivatives of polyaniline, polythiophene and the like.

As a forming material, the hole transport layer 42 employed in the organic EL device portion 31 in the present invention can use, for example, the above-described p-type semiconductor material usable for the organic semiconductor layers. Usable examples include those commonly used as hole transport materials, such as phthalocyanine, naphthalocyanine, polyphyrin, oxadiazole, triphenylamine, triazole, imidazole, imidazolone, pyrazoline, tetrahydroimidazole, hydrazone, stilbene, pentacene, polythiophene and butadiene, and their derivatives. As the forming material of the hole transport layer 42, a commercially-available, hole transport material such as, for example, poly(3,4-ethylenedioxythiophene)/polystyrene sulfonate (abbreviation: PEDOT/PSS, trade name: "CLEVIOS P" (product of H.C. Starck Clevis GmbH) can also be used. The hole transport layer 42 can be formed by a vapor deposition process or by using a coating formulation for the formation of hole transport layers, which contains such a compound. It is to be noted that such a hole transport material may be mixed in the light-transmitting layer 43 or the hole injection layer 41.

As the hole transport material in the present invention, the above-described material can be used. In the organic layers such as the above-mentioned light-emitting layer 43 and charge transport layer, a light-emitting, oligomer or dendrimer material or a charge transport or injection, oligomer or dendrimer material may be incorporated as needed. As the charge mobility of the hole transport layer 42, it is preferred to have a hole mobility of $10^{-6}$ cm$^2$/Vs or higher. Any desired material other than the above-mentioned materials may also be used provided that it has higher transport capability for holes than for electrons. The hole transport layer 42 can be not only a single layer containing one of the materials having high hole transport capability but also a stacked layer of two or more layers containing different ones of such materials, respectively.

In the present invention, the organic EL device portion 31 may include an electron injection layer as needed. Examples of the forming material of the electron injection layer include, in addition to the compounds exemplified above as light-emitting materials for the light-emitting layer 43, alkali metals and alkaline earth metals such as lithium, sodium, potassium, rubidium, cesium, beryllium, magnesium, calcium, strontium and barium, and halides and oxides of such alkali metals and alkaline earth metals.

The exciton blocking layer 44 in the organic EL device portion 31 in the present invention functions as a hole blocking layer, an electron blocking layer and the like, prevents penetration of carriers (holes and electrons), allows efficient recombination of carriers. When bathocuproine (BCP) is used as a forming material for the exciton blocking layer 44, the exciton blocking layer 44 does not block electrons from Me-PTC but blocks holes from Alq3 because BCP has a LUMO energy level substantially equal to that of Me-PTC and a HOMO energy level higher than that of Alq3. As the excitation state of BCP is higher in energy than that of Alq3, excitons produced in Alq3 do not diffuse into BCP.

The above-described individual layers that make up the organic EL device portion 31 in the present invention can be formed as films by a vacuum deposition process, or can be formed by separately dissolving or dispersing their forming materials in portions of a solvent such as toluene, chloroform, dichloromethane, tetrahydrofuran or dioxane to prepare coating formulations and coating or printing these coating formulations with a coater or printer.

EXAMPLES

A description will hereinafter be made about examples of the present invention. Transistor devices fabricated in the examples and a comparative example were evaluated by the following method.
(Evaluation of Transistor Devices)

With respect to each transistor device fabricated, a collector voltage Vc was applied between an emitter electrode and a collector electrode, and a base voltage (Vb) to be applied between the emitter electrode and a base electrode was modulated in a range of from 0 V to 3 V. As output modulation characteristics of the transistor device, changes in base current Ib and collector current Ic (on-state currents, off-state currents) were measured while applying the base voltage Vb (0 to 3 V) between the emitter electrode and the base electrode with the collector voltage (Vc) being kept constant between the emitter electrode and collector electrode. Further, the ratio of a change in collector current to a corresponding change in base current, i.e., the current amplification factor ($h_{FE}$) and the ratio of an on-stage current to a corresponding off-state current, i.e., the on/off ratio were calculated.

Example 1

Fabrication of Transistor Device by Diode Structure
(C60/Copper Phthalocyanine)

Figure 5:
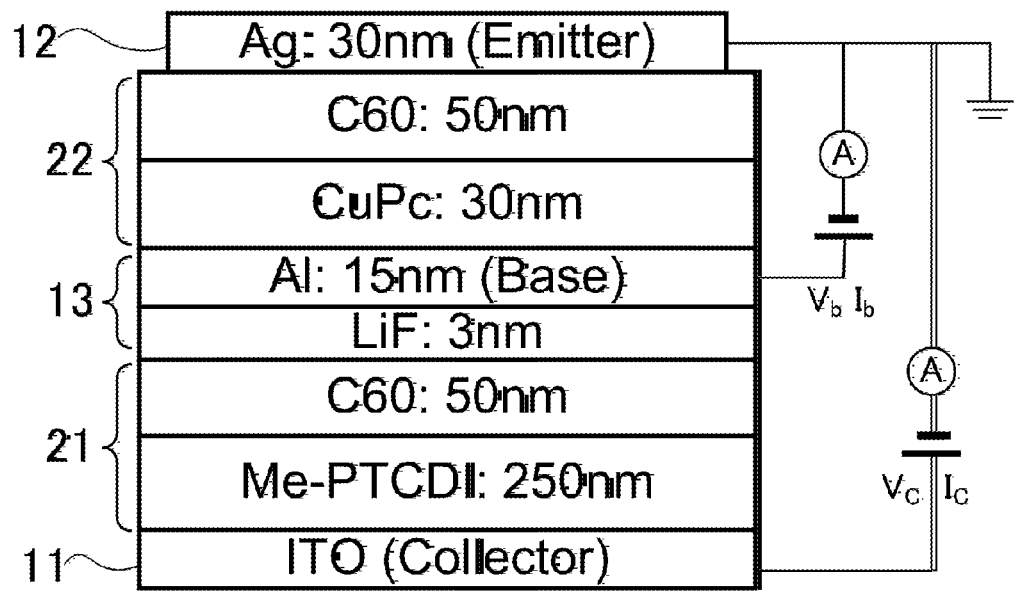
FIG. 5 is a simplified schematic cross-sectional view illustrating the construction of a transistor device fabricated in Example 1.

As illustrated in FIG. 5, an ITO-coated transparent substrate was provided as a collector electrode 11. After an organic semiconductor layer (average thickness: 250 nm) of N,N'-dimethylperylenetetracarboxylic acid diimide (Me-PTCDI, organic semiconductor material) was formed on the collector electrode 11, another organic semiconductor layer (average thickness: 50 nm) of fullerene (C60) was formed to provide a collector layer 21. Subsequent to the formation of an electrode layer (average thickness: 3 nm) of lithium fluoride as an electron injection layer, a base electrode layer (average thickness: 15 nm) of aluminum was stacked to form a base electrode 13. On the base electrode 13, a p-type organic semiconductor layer (average thickness: 30 nm) of copper phthalocyanine and an n-type organic semiconductor layer (average thickness: 50 nm) of fullerene (C60) were stacked in this order by a vacuum deposition process, whereby an emitter layer 22 of a diode structure was provided. An emitter electrode 12 (average thickness: 30 nm) of silver was then stacked by a vacuum deposition process to obtain a metal-base organic transistor device (MBOT) of Example 1.

Figure 7:
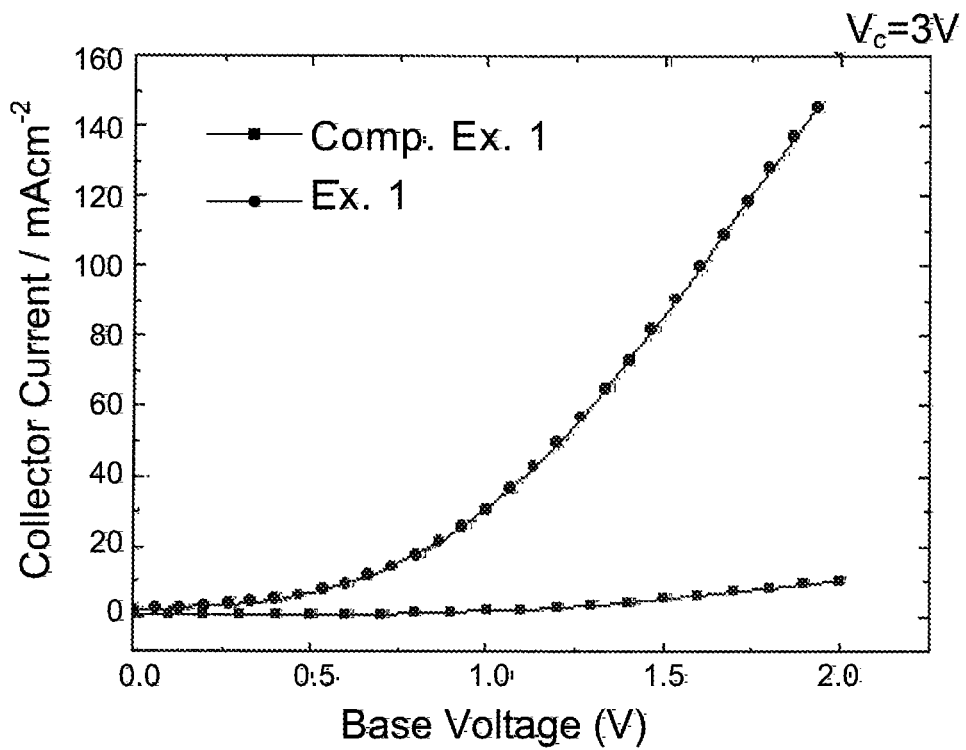
FIG. 7 is a diagram illustrating output characteristics (Ic-Vb curves) of the transistor device of Example 1 and a transistor device of Comparative Example 1.

As output modulation characteristics of the transistor device obtained in Example 1, changes in collector current Ic and base current Ib were measured while applying a base voltage Vb (0 to 2 V) between the emitter electrode and the base electrode and also while applying no base voltage Vb, both with the collector voltage Vc being kept constant at 3 V between the emitter electrode and collector electrode. The changes in collector current while the base voltage was applied (Ic-Vb characteristics) are shown in FIG. 7. The on-state current and current amplification factor of the collector current Ic when a collector voltage (Vc: 3 V) and a base voltage (Vb: 1.1 V) were applied, the off-state current when Vb=0 V, and the on/off ratio are presented in Table 1.

Example 2

Fabrication of Transistor Device by Diode Structure
(C60/Pentacene)

Similar to Example 1, an ITO-coated transparent substrate was provided as a collector electrode 11. After an organic semiconductor layer (average thickness: 250 nm) of N,N'-dimethylperylenetetracarboxylic acid diimide (Me-PTCDI, organic semiconductor material) was formed on the collector electrode 11, another organic semiconductor layer (average thickness: 50 nm) of fullerene (C60) was formed to provide a collector layer 21. Subsequent to the formation of an electrode layer (average thickness: 3 nm) of lithium fluoride as an electron injection layer on the collector layer 21, a base electrode layer (average thickness: 15 nm) of aluminum was stacked to form a base electrode 13. On the base electrode 13, a p-type organic semiconductor layer (average thickness: 30 nm) of pentacene and an n-type organic semiconductor layer (average thickness: 50 nm) of fullerene (C60) were stacked in this order by a vacuum deposition process, whereby an emitter layer 22 of a diode structure was provided. An emitter electrode 12 (average thickness: 30 nm) of silver was further stacked by a vacuum deposition process to obtain a metal-base organic transistor device (MBOT) of Example 2.

Figure 8:
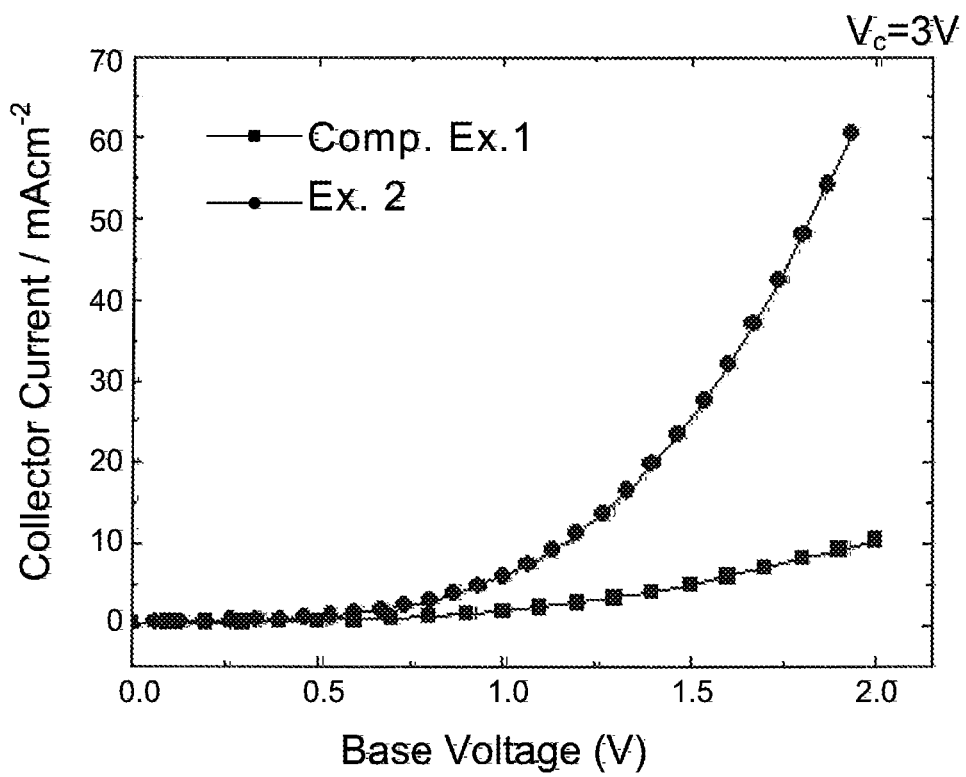
FIG. 8 is a diagram illustrating output characteristics (Ic-Vb curves) of a transistor device of Example 2 and the transistor device of Comparative Example 1.

As output modulation characteristics of the transistor device obtained in Example 2, changes in collector current Ic and base current Ib were measured while applying a base voltage Vb (0 to 2 V) between the emitter electrode and the base electrode and also while applying no base voltage Vb, both with the collector voltage Vc being kept constant at 3 V between the emitter electrode and collector electrode. The changes in collector current while the base voltage was applied (Ic-Vb characteristics) are shown in FIG. 8. The on-state current and current amplification factor of the collector current Ic when a collector voltage (Vc: 3 V) and a base voltage (Vb: 1.7 V) were applied, the off-state current when Vb=0 V, and the on/off ratio are presented in Table 2.

Example 3

Fabrication of Light-Emitting Transistor Device by Diode Structure (B4PYMPM/Pentacene)

Figure 6:
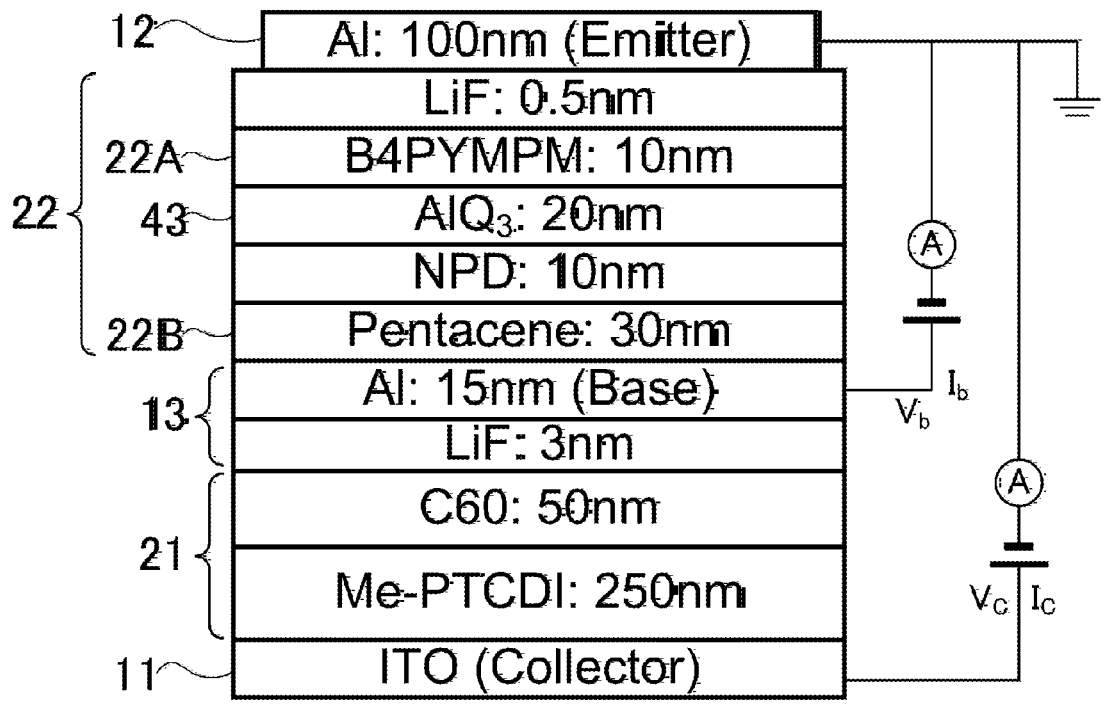
FIG. 6 is a simplified schematic cross-sectional view illustrating the construction of a transistor device fabricated in Example 3.

As depicted in FIG. 6, an ITO-coated transparent substrate was provided as a collector electrode 11. After an organic semiconductor layer (average thickness: 250 nm) of N,N'-dimethylperylenetetracarboxylic acid diimide (Me-PTCDI, organic semiconductor material) was formed on the collector electrode 11, another organic semiconductor layer (average thickness: 50 nm) of fullerene (C60) was formed to provide a collector layer 21 of a stacked structure. Subsequent to the formation of an electrode layer (average thickness: 3 nm) of lithium fluoride as an electron injection layer on the collector layer 21, an electrode layer (average thickness: 15 nm) of aluminum was stacked to form a base electrode 13. On the base electrode 13, a p-type organic semiconductor layer (average thickness: 30 nm) 22B of pentacene, a hole transport layer (average film thickness: 10 nm) of α-NPD [Bis(N-(1-naphthyl)-N-phenyl)benzidine] as a pore transport material, an organic light-emitting layer 43 (average film thickness: 20 nm) of Alq3 [tris(8-hydroxyquinolinol)aluminum) complex], an electron transport layer 22A (average thickness: 10 nm) of a pyrimidine derivative B4PYMPM (below-described formula (1)) as an electron transport material, and lithium fluoride as an electron injection layer (average film thickness: 0.5 nm) were successively stacked by a vacuum deposition process, whereby an emitter layer 22 of a diode structure was formed with the organic light-emitting layer 43 embedded therein. On the emitter layer 22, an emitter electrode 12 (average thickness: 100 nm) of aluminum was further stacked by a vacuum deposition process to obtain a light-emitting, metal-base, organic transistor device (MBOT) of Example 3.

Formula (1)

B4PYMPM

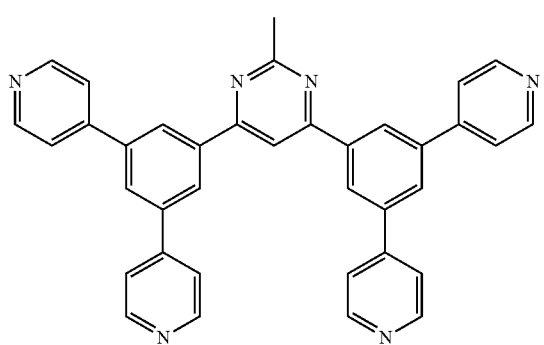

A collector voltage (Vc: 12 V) was applied to the resultant light-emitting transistor device to confirm if any emission of light would occur. No emission of light was confirmed when no base voltage (Vb: 0 V) was applied, but an emission of light from the emitter layer was confirmed when a base voltage (Vb: 10 V) was applied.

Comparative Example 1

Fabrication of Transistor Device from C60

An ITO-coated transparent substrate was provided as a collector electrode, and a collector layer was formed as in Example 1. Subsequent to the formation of an electrode layer (average thickness: 3 nm) of lithium fluoride as an electron injection layer on the collector layer as in Example 1, a base electrode layer (average thickness: 15 nm) of aluminum was stacked to form a base electrode. On the base electrode, an n-type organic semiconductor layer (average thickness: 80 nm) of fullerene (C60) was stacked by a vacuum deposition process, whereby a non-diode structure of the n-type organic semiconductor material was formed. An emitter electrode 12 (average thickness: 30 nm) of silver was further stacked by a vacuum deposition process to obtain a transistor device of Comparative Example 1.
(Evaluation Results)

As output modulation characteristics of the resultant transistor device, changes in collector current Ic and base current Ib were measured while applying a base voltage Vb (0 to 2 V) between the emitter electrode and the base electrode and also while applying no base voltage Vb, both with the collector voltage Vc being kept constant at 3 V between the emitter electrode and collector electrode. The transistor device was confirmed to operate as MBOT. The evaluation results are presented in Tables 1 and 2, and are shown in FIGS. 7 and 8.

TABLE 1

Characteristics of MBOTs (Vb: 0 to 1.1 V, Vc: 3 V)

|  | Ex. 1 | Comp. Ex. 1 |
|---|---|---|
| Emitter layer | C60/Cu-Pc | C60 |
| On-state current (mA/cm$^2$) | 36.4 | 2.2 |
| Off-state current (mA/cm$^2$) | 1.8 | 0.3 |
| Amplification factor ($h_{FE}$) | 98.4 | 10.3 |
| On/off ratio | 20.3 | 6.5 |

TABLE 2

Characteristics of MBOTs (Vb: 0 to 1.7 V, Vc: 3 V)

|  | Ex. 2 | Comp. Ex. 1 |
|---|---|---|
| Emitter layer | C60/Pentacene | C60 |
| On-state current (mA/cm$^2$) | 42.5 | 7.1 |
| Off-state current (mA/cm$^2$) | 0.4 | 0.3 |
| Amplification factor ($h_{FE}$) | 160.4 | 22.2 |
| On/off ratio | 116.8 | 20.8 |

The organic transistor device of Example 1 was confirmed to function as a current-amplifying transistor device. It shows the large amplification factor of 98.4 at the low voltage. Further, its on-state current was 36.4 mA/cm$^2$ (Vb: 1.1 V) and 145 mA/cm$^2$ (Vb: 2.0 V). It, therefore, performed modulation of a very large current as a transistor device. In addition, its on/off ratio (Vb: 1.1 V) was 20.3.

The organic transistor device of Example 2 was also confirmed to function as a current-amplifying transistor device. It shows the large amplification factor of 160.4 at the low voltage. Further, its on-state current was 42.5 mA/cm$^2$ (Vb: 1.7 V) and 62 mA/cm$^2$ (Vb: 2.0 V). It, therefore, performed modulation of a very large current as a transistor device. In addition, its on/off ratio (Vb: 1.7 V) was 116.8.

On the other hand, the transistor device of Comparative Example 1 was confirmed to operate and to function as a transistor device that as MBOT, has current amplification capability, and reduces a dark current. When the collector voltage (Vc: 3 V) was applied, however, the on-state current value was 2.2 mA/cm$^2$ (Vb: 1.1 V) and 7.1 mA/cm$^2$ (Vb: 1.7 V) so that only a small current was available.

The transistor devices of Examples 1 and 2 provided, as their on-state currents, currents approximately 17 and 6 times as large as their corresponding on-currents available from the transistor device of Comparative Example 1, and further, their off-state currents were suppressed. The transistor devices of Examples 1 and 2, therefore, showed excellent transistor characteristics. Further, the light-emitting transistor device of Example 3 was confirmed to show a high on/off ratio.

As demonstrated above, the transistor device according to the present invention has been confirmed to perform large-current modulation at a low voltage, to provide a high on/off ratio, and to apparently function as a similar effective current-amplifying transistor device as a bipolar transistor. Further, the introduction of a light-emitting layer in the emitter layer has been found to provide a light-emitting transistor device which can perform a self-emission while enjoying the advantageous effects of the transistor device according to the present invention.

INDUSTRIAL APPLICABILITY

The transistor device according to the present invention provides a small off-state current and a high on/off ratio, and therefore, can be used as a drive device for a display such as an organic EL display. When an organic light-emitting layer is incorporated, the transistor device according to the present invention can be used as an organic light-emitting transistor device.

REFERENCE SIGNS LIST

11 Collector electrode
12 Emitter electrode
13 Base electrode
21 Organic semiconductor layer (collector layer)
22 Organic semiconductor layer (emitter layer)
22A n-Type organic semiconductor layer or p-type organic semiconductor layer
22B p-Type organic semiconductor layer or n-type organic semiconductor layer
31 Organic EL device portion
41 Hole injection layer
42 Hole transport layer
43 Light-emitting layer
44 Exciton blocking layer

The invention claimed is:

1. A current-amplifying transistor device provided with an emitter electrode, a collector electrode, first and second organic semiconductor layers formed between the emitter electrode and the collector electrode, and a sheet-shaped base electrode formed between the first organic semiconductor layer and the second organic semiconductor layer,
    wherein the first organic semiconductor layer is arranged between the emitter electrode and the base electrode, and has a diode structure of a p-type organic semiconductor layer and an n-type organic semiconductor layer, and
    wherein the second organic semiconductor layer is arranged between the collector electrode and the base electrode, and comprises an n-type organic semiconductor layer or a p-type organic semiconductor layer.

2. The current-amplifying transistor device according to claim 1, wherein the second organic semiconductor layer comprises an n-type organic semiconductor layer, and the first organic semiconductor layer has a diode structure of a p-type organic semiconductor layer formed above the base electrode and an n-type organic semiconductor layer formed below the emitter electrode.

3. The current-amplifying transistor device according to claim 2,
    wherein the second organic semiconductor layer comprises the n-type organic semiconductor layer, and comprises a stacked organic semiconductor layer obtainable by stacking an organic semiconductor layer, which is formed from N,N'-dimethylperylenetetracarboxylic acid dilmide (Me-PTCDI), and another organic semiconductor layer, which is formed from fullerene (C60), together.

4. The current-amplifying transistor device according to claim 2, further comprising a lithium fluoride layer formed between the base electrode and the second organic semiconductor layer.

5. The current-amplifying transistor device according to claim 2, wherein the p-type organic semiconductor layer in the first organic semiconductor layer is formed from a metal phthalocyanine or a non-metal phthalocyanine.

6. The current-amplifying transistor device according to claim 2, wherein the p-type organic semiconductor layer in the first organic semiconductor layer is formed from pentacene.

7. A current-amplifying, light-emitting transistor device comprising the current-amplifying transistor device according to claim 2, and an organic EL device portion formed between the p-type organic semiconductor layer and the n-type organic semiconductor layer in the first organic semiconductor layer, wherein the organic EL device portion comprises an organic light-emitting layer and at least one layer selected from the group consisting of a hole injection layer, a hole transport layer, an electron transport layer and an electron injection layer.

8. A current-amplifying, light-emitting transistor device comprising the current-amplifying transistor device according to claim 2, and an organic EL device portion formed between the second organic semiconductor layer and the collector electrode, wherein the organic EL device portion comprises an organic light-emitting layer and at least one layer selected from the group consisting of a hole injection layer, a hole transport layer, an electron transport layer and an electron injection layer.

9. The current-amplifying transistor device according to claim 1, wherein the p-type organic semiconductor layer and n-type organic semiconductor layer in the first organic semiconductor layer are a hole transport material layer and an electron transport material layer, respectively.

10. The current-amplifying transistor device according to claim 9, further comprising a lithium fluoride layer formed between the base electrode and the second organic semiconductor layer.

11. The current-amplifying transistor device according to claim 1, wherein the p-type organic semiconductor layer in the first organic semiconductor layer is formed from a metal phthalocyanine or a non-metal phthalocyanine.

12. The current-amplifying transistor device according to claim 11,
    wherein the second organic semiconductor layer comprises the n-type organic semiconductor layer, and comprises a stacked organic semiconductor layer obtainable by stacking an organic semiconductor layer, which is formed from N,N'-dimethylperylenetetracarboxylic acid dilmide (Me-PTCDI), and another organic semiconductor layer, which is formed from fullerene (C60), together.

13. The current-amplifying transistor device according to claim 11, further comprising a lithium fluoride layer formed between the base electrode and the second organic semiconductor layer.

14. The current-amplifying transistor device according to claim 1, wherein the p-type organic semiconductor layer in the first organic semiconductor layer is formed from pentacene.

15. The current-amplifying transistor device according to claim 14,
    wherein the second organic semiconductor layer comprises the n-type organic semiconductor layer, and comprises a stacked organic semiconductor layer obtainable by stacking an organic semiconductor layer, which is formed from N,N'-dimethylperylenetetracarboxylic acid dilmide (Me-PTCDI), and another organic semiconductor layer, which is formed from fullerene (C60), together.

16. The current-amplifying transistor device according to claim 14, further comprising a lithium fluoride layer formed between the base electrode and the second organic semiconductor layer.

17. The current-amplifying transistor device according to claim 1, wherein the second organic semiconductor layer comprises the n-type organic semiconductor layer, and comprises a stacked organic semiconductor layer obtainable by stacking an organic semiconductor layer, which is formed from N,N'-dimethylperylenetetracarboxylic acid dilmide (Me-PTCDI), and another organic semiconductor layer, which is formed from fullerene (C60), together.

18. The current-amplifying transistor device according to claim 17, further comprising a lithium fluoride layer formed between the base electrode and the second organic semiconductor layer.

19. The current-amplifying transistor device according to claim 1, further comprising a lithium fluoride layer formed between the base electrode and the second organic semiconductor layer.

20. The current-amplifying transistor device according to claim 1, which has a current amplification factor of at least 50 at a low voltage not higher than 5 V.

21. The current-amplifying transistor device according to claim 1, which has an on/off ratio of at least 100.

22. A current-amplifying, light-emitting transistor device comprising the current-amplifying transistor device according to claim 1, and an organic EL device portion formed between the p-type organic semiconductor layer and the n-type organic semiconductor layer in the first organic semiconductor layer, wherein the organic EL device portion comprises an organic light-emitting layer and at least one layer selected from the group consisting of a hole injection layer, a hole transport layer, an electron transport layer and an electron injection layer.

23. A current-amplifying, light-emitting transistor device comprising the current-amplifying transistor device according to claim 1, and an organic EL device portion formed between the second organic semiconductor layer and the collector electrode, wherein the organic EL device portion comprises an organic light-emitting layer and at least one layer selected from the group consisting of a hole injection layer, a hole transport layer, an electron transport layer and an electron injection layer.

24. The current-amplifying transistor device according to claim 1, wherein
the second organic semiconductor layer comprises the p-type organic semiconductor layer, and
the first organic semiconductor layer has a diode structure wherein the n-type organic semiconductor layer is formed above the base electrode, and the p-type organic semiconductor layer is formed below the emitter electrode.

25. The current-amplifying transistor device according to claim 24,
wherein the first organic semiconductor layer comprises the n-type organic semiconductor layer, and comprises a stacked organic semiconductor layer obtainable by stacking an organic semiconductor layer, which is formed from N,N'-dimethylperylenetetracarboxylic acid dilmide (Me-PTCDI), and another organic semiconductor layer, which is formed from fullerene (C60), together.

26. The current-amplifying transistor device according to claim 24, wherein the p-type organic semiconductor layer in the first organic semiconductor layer is formed from a metal phthalocyanine or a non-metal phthalocyanine.

27. The current-amplifying transistor device according to claim 24, wherein the p-type organic semiconductor layer in the first organic semiconductor layer is formed from pentacene.

28. The current-amplifying transistor device according to claim 24, further comprising a lithium fluoride layer formed between the base electrode and the second organic semiconductor layer.

29. A current-amplifying, light-emitting transistor device comprising the current-amplifying transistor device according to claim 24, and an organic EL device portion formed between the p-type organic semiconductor layer and the n-type organic semiconductor layer in the first organic semiconductor layer, wherein the organic EL device portion comprises an organic light-emitting layer and at least one layer selected from the group consisting of a hole injection layer, a hole transport layer, an electron transport layer and an electron injection layer.

30. A current-amplifying, light-emitting transistor device comprising the current-amplifying transistor device according to claim 24, and an organic EL device portion formed between the second organic semiconductor layer and the collector electrode, wherein the organic EL device portion comprises an organic light-emitting layer and at least one layer selected from the group consisting of a hole injection layer, a hole transport layer, an electron transport layer and an electron injection layer.

* * * * *